United States Patent [19]
Ogawa

[11] Patent Number: 4,551,691
[45] Date of Patent: Nov. 5, 1985

[54] HYSTERESIS CIRCUIT WITH SMALL HYSTERESIS AMPLITUDE AND OSCILLATOR USING THE HYSTERESIS CIRCUIT

[75] Inventor: Atsushi Ogawa, Yokohama, Japan

[73] Assignee: Tokyo Shibaura Denki Kabushiki Kaisha, Japan

[21] Appl. No.: 537,064

[22] Filed: Sep. 29, 1983

[30] Foreign Application Priority Data

Sep. 29, 1982 [JP] Japan .............................. 57-170376
Sep. 29, 1982 [JP] Japan .............................. 57-170387

[51] Int. Cl.$^4$ ............................................. H03K 3/26
[52] U.S. Cl. .................................. 331/111; 331/143; 331/177 R
[58] Field of Search .................... 331/111, 143, 177 R

[56] References Cited
U.S. PATENT DOCUMENTS

| 3,803,516 | 4/1974 | Wilcox | 331/111 |
| 4,161,703 | 7/1979 | Nutz | 331/111 |
| 4,233,575 | 11/1980 | Chapman et al. | 331/111 |

Primary Examiner—Eugene R. LaRoche
Assistant Examiner—D. C. Mis
Attorney, Agent, or Firm—Finnegan, Henderson, Farabow, Garrett & Dunner

[57] ABSTRACT

A hysteresis circuit producing a relatively stable hysteresis output signal, which includes a power source, a reference potential source, a transistor, a constant current source, output means and means for detecting the collector current and for controlling the constant current source. The transistor is connected at its collector to the power source via the constant current source and at its emitter to the reference potential source. The constant current source supplies a constant current switchable between first and second levels. The output means is responsive to the first and second levels of current for deriving a bilevel hysteresis output signal dependent on the first and second levels of current. The detecting and controlling means detects the collector current of the transistor and controls the current source between the first and second levels of current in response to the collector current.

10 Claims, 12 Drawing Figures

HYSTERESIS CIRCUIT WITH SMALL HYSTERESIS AMPLITUDE AND OSCILLATOR USING THE HYSTERESIS CIRCUIT

BACKGROUND OF THE INVENTION

This invention relates to a hysteresis circuit and an oscillator using a hysteresis circuit. More particularly, the invention pertains to circuits which permit a small oscillation amplitude or hysteresis amplitude while permitting their operation at low supply voltages.

DESCRIPTION OF THE PRIOR ART

Hysteresis circuits are often used in oscillator circuits, and many forms of these circuits have been developed.

As is well-known, hysteresis circuits are essential for stable processing of various types of signals. A requirement for hysteresis circuits is that the hysteresis amplitude is easily set over a wide range of values. Hysteresis circuits ideally must operate at a lower power supply voltage with low power consumption.

In practice, the hysteresis amplitude of a conventional hysteresis circuit is difficult to set and stability of a small hysteresis amplitude is difficult to attain. More importantly, there is the considerable drawback that operation with a low supply voltage is not possible, which is not good from the point of view of provision of the circuit in compact, portable electronic equipment.

One type of conventional hysteresis circuit is shown in FIG. 1 and is more fully discussed below.

SUMMARY OF THE INVENTION

The subject invention relates to a novel hysteresis circuit and a novel oscillator for producing a hysteresis output or an oscillation output for which the amplitude is easily set over a wide range of values, yet which is able to operate at a relatively low power supply voltage with low power consumption.

These and other objects are achieved in the hysteresis circuit or oscillator of the invention which essentially includes a transistor constituting an emitter-grounded amplifier, a first means supplying the collector side of this transistor with constant current of one of different levels, and a second means which detects the difference between the collector current of the transistor and the current supplied by the first means and changes the magnitude of the level of the first means constant current in response to the detected value of the difference.

Accordingly, an object of the present invention is to provide a hysteresis circuit and an oscillator of which hysteresis or oscillation amplitude is easily set over a wide range of values.

Another object of the present invention is to provide a hysteresis circuit and an oscillator which are able to operate with a low power supply voltage.

A further object of the present invention is to provide a hysteresis circuit and an oscillator which is low in power consumption.

Additional objects, advantages, and features of the present invention will further become apparent to persons skilled in the art from a study of the following description and of the accompanying drawings, in which:

DESCRIPTION OF THE PREFERRED EMBODIMENTS

Figure 1:
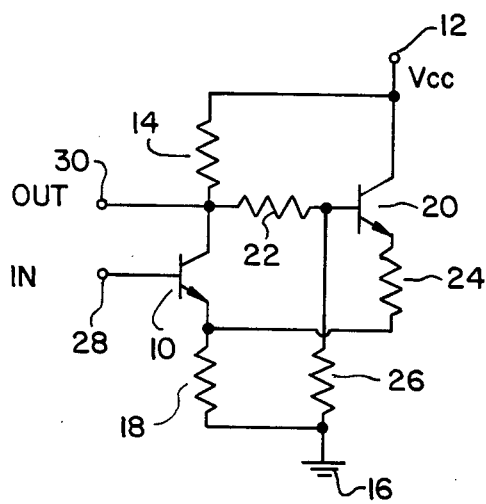
FIG. 1 is a circuit diagram showing the configuration of a conventional hysteresis circuit.

The present invention will now be described in detail with reference to the accompanying drawings, namely, FIGS. 1 to 12. Throughout the drawings, like reference numerals and letters are used to designate like or equivalent elements for the sake of simplicity of explanation.

Referring to FIG. 1, there is shown an example of a hysteresis circuit in common use in transistor circuits. As shown, first NPN transistor 10 is connected at its collector to power source supply terminal 12 to which is applied the positive power source voltage $V_{cc}$ through resistor 14. The emitter of first transistor 10 is connected to reference potential terminal 16 through resistor 18. Second NPN transistor 20 is connected at its collector to power source supply terminal 12. The base and emitter of second transistor 20 are respectively connected to the collector and emitter of first transistor 10 through individual resistors 22 and 24. The base of second transistor 20 is further connected to reference potential terminal 16 through resistor 26. Input terminal 28 and output terminal 30 of the circuit are respectively connected to the base and the collector fo first transistor 10.

Figure 2:
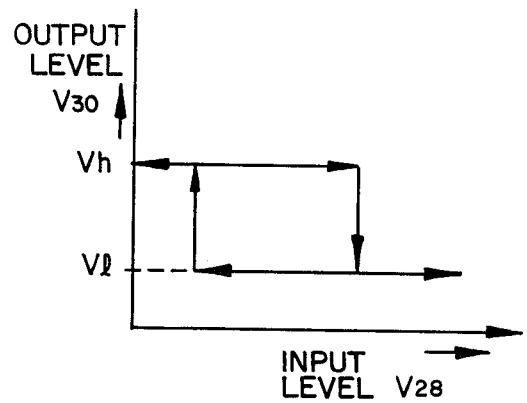
FIG. 2 is a graph showing the hysteresis characteristic according to the circuit of FIG. 1.

The operation or input-output characteristics of the circuit of FIG. 1 are shown in FIG. 2. When input signal level $V_{28}$ at input terminal 28 is lower than a threshold level of NPN transistor, first transistor 10 is in an OFF state and second transistor 20 is in an ON state. Then output signal level $V_{30}$ at output terminal 30 is at the high potential state $V_h$:

$$V_h = [(R_{22} + R_{26})/(R_{14} + R_{22} + R_{26})] \times V_{cc}$$

In this state, potential $V_a$ at the junction of resistors 24 and 18, that is, the emitter potential of first transistor 10 becomes:

$$V_a = [(R_{26}/(R_{14} + R_{22} + R_{26})] \times V_{cc} - 0.7] \times [R_{18}/(R_{24} + R_{18})]$$

Where $R_{14}$, $R_{18}$, $R_{22}$, $R_{24}$ and $R_{26}$ are individual resistances of resistors 14, 18, 22, 24 and 26.

When input signal level $V_{28}$ becomes approximately $V_a + 0.7$ V or more, first transistor 10 is turned ON, and, with second transistor 20 OFF, the output signal level $V_{30}$ at output terminal 30 is at the low potential state $V_l$:

$$V_l = [[(R_{22} + R_{26})//R_{18}][R_{14} + (R_{22} + R_{26})//R_{18}]] \cdot V_{cc}$$

In this state, first transistor 10 remains ON even if input signal level $V_{28}$ falls a little below the voltage; $V_a+0.7$ V. When input signal level $V_{28}$ falls below 0.7 V, first and second transistors 10 and 20 respectively turn their states to OFF and ON. Then output signal level $V_{30}$ turns high potential state $V_h$.

Accordingly, the circuit of FIG. 1 possesses a hysteresis characteristic as shown in FIG. 2. The hysteresis amplitude of the output signal level $V_{30}$ is given by the equation; $V_h-V_l$.

However, using the hysteresis circuit of FIG. 1, there are the problems connected with setting and stably maintaining a small hysteresis amplitude since a set hysteresis amplitude ($V_h-V_l$) is obtained by setting the values of resistors $R_{14}$, $R_{18}$, $R_{22}$, $R_{24}$ and $R_{26}$. A more significant disadvantage is the considerable drawback that the circuit contains a large number of resistors that are connected in series during operation and so operation with a low supply voltage $V_{cc}$, such as 1 volt or lower, is not possible. Thus this type of circuit is not readily adaptable to compact, portable electronic equipment.

Figure 3:
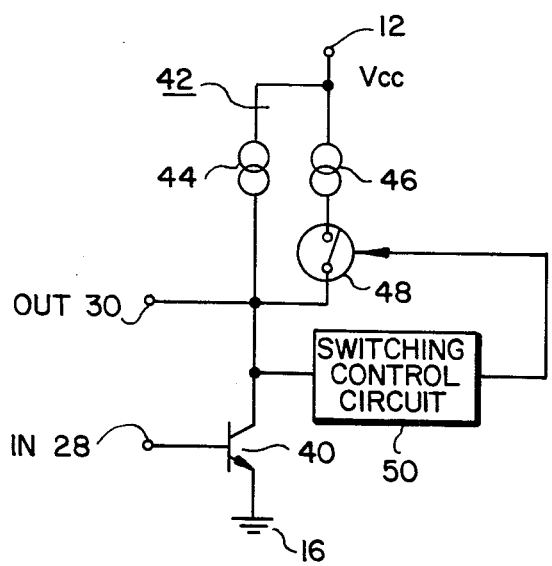
FIG. 3 is a circuit showing the basic configuration of a hysteresis circuit according to the invention.

Referring now to FIG. 3, the circuit diagram shown is a hysteresis circuit constructed according to the present invention. in FIG. 3, transistor 40, e.g. a NPN transistor, which performs an important action in the hysteresis circuit of the invention, has its emitter connected to reference potential terminal 16 and its collector connected to output terminal 30. The collector of transistor 40 is further connected to power source supply terminal 12 with power source voltage $V_{cc}$ via constant current source 42. Constant current source 42 includes a pair of first and second constant current supply means 44 and 46 in parallel with each other. First constant current supply means 44 is directly connected between power source supply terminal 12 and the collector of transistor 40 and provides constant current $I_{44}$. Second constant current supply means 46 is connected between power source supply terminal 12 and the collector of transistor 40 via switch means 48 and provides constant current $I_{46}$. Further, switching control circuit 50 is connected at its input terminal to the collector of transistor 40 and at its control terminal to switch means 48.

Switching control circuit 50 activates switch means 48 when a current flows through it and deactivates switch means 48 when a current does not flow through it.

Figure 4:
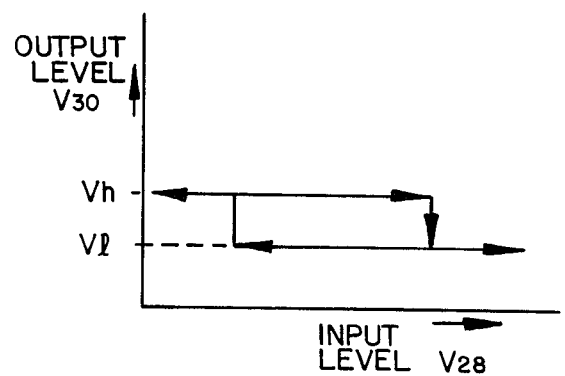
FIG. 4 is a graph showing the hysteresis characteristic according to the circuit of FIG. 3.

The operation of the hysteresis circuit of FIG. 3 is described now using the graph shown in FIG. 4.

When input signal level $V_{28}$ at input terminal 28 is low, transistor 40 is biased to be less conductive. Then output level $V_{30}$ on output terminal 30 is set to high level $V_h$ given by the equation as described below. In this state, the collector current of transistor 40 is limited to be less than the constant current supplied from constant current source 42. The remainder of the constant current $I_{44}$ flows into switching control circuit 50, and switching control circuit 50 activates switch means 48 to connect second constant current supply means 46 to the collector of transistor 40. Therefore, constant current source 42 supplies a sum of currents from the first and second constant current supply means 44 and 46, that is $I_{44}+I_{46}$. The aforementioned high level voltage $V_h$ is given as follows:

$$V_h = V_T \times \ln\left[(I_{44}+I_{46})/I_s\right]$$

Where $V_T$ is thermal voltage defined as $V_T=kT/q$, where k is Boltzman's constant, T absolute temperature, and q electron charge, and $I_s$ is the reverse saturation current of transistor 40.

Next, when input signal level $V_{28}$ increases to bias transistor 40 to a relatively more conductive state, for example, full saturation state, all of the total current $I_{44}+I_{46}$ supplied from constant current source 42 at the time flows into transistor 40. Output signal level $V_{30}$ on output terminal 30 drops to low level voltage $V_l$ given by the equation described below. Further the flow of the total current $I_{44}+I_{46}$ supplied from constant current source 42 into transistor 40 results in little current flow into switching control means 50. Therefore, switching control circuit 50 deactivates switch means 48 and thus second constant current supply means 46 is disconnected from the collector of transistor 40. Thus the current supplied from constant current source 42 is suddenly changed to constant current $I_{44}$ supplied by first constant current supply means 44 only, in spite of transistor 40 being biased in the high conductive state capable of accepting the total current $I_{44}+I_{46}$ of constant current source 42. The aforementioned low output level $V_l$ is determined as follows:

$$V_l = V_T \times \ln (I_{44}/I_s)$$

In this state, even if input level $V_{28}$ at input terminal 28 falls some, transistor 40 is still biased so as to accept the full current supplied from constant current source 42 at that time, that is, $I_{44}$ of first constant current supply means 44. Switching control circuit 50 therefore receives little current so that second constant current supply means 46 remains disconnected. Output level $V_l$ (low level) is maintained at output terminal 30.

When input signal level $V_{28}$ on input terminal 28 decreases to bias transistor 40 to be less conductive so that the collector current thereof decreases below constant current $I_{44}$ supplied from constant current source 42 at that time, output level $V_{30}$ on output terminal 30 returns to high level $V_h$, as shown in FIG. 4. In this state, the remainder of constant current $I_{44}$ begins to flow into switching control circuit 50. Therefore, switching control circuit 50 activates switch means 48 to connect second constant current supply means 46 to the collector of transistor 40. As a result, transistor 40 firmly acts to maintain output level $V_{30}$ to high level $V_h$.

Thus, hysteresis amplitude $V_{h1}$ of the circuit of FIG. 3 is representable as:

$$V_{h1} = V_h - V_l = V_T \times \ln\left[(I_{44}+I_{46})/I_{44}\right]$$

That is, hysteresis amplitude $V_{h1}$ is determined by the current ratio between full constant current $I_{44}+I_{46}$ and constant current $I_{44}$ at each state of constant current source 42. Hysteresis amplitude $V_{h1}$ has the approximate value 60 mV, assuming that $V_T$ is 26 mV at normal temperature and the current ratio $I_{44}:I_{44}+I_{46}$ is 1:10.

There now follows a detailed description of embodiments of the invention constructed in accordance with the above described basic construction.

Figure 5:
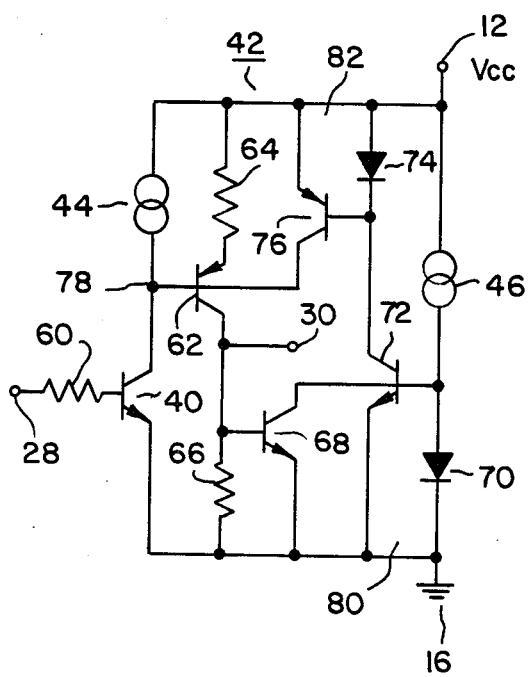
FIG. 5 is a circuit diagram showing one embodiment of a hysteresis circuit according to the invention.

As shown in FIG. 5, input terminal 28 is connected via resistor 60 to the base of NPN transistor 40. The emitter of transistor 40 is connected to reference potential terminal 16. The collector of transistor 40 is connected to power source supply terminal 12 through first constant current supply means 44. The collector is, further, connected to the base of PNP transistor 62. The emitter of transistor 62 is connected to power source supply terminal 12 via resistor 64, while its collector is connected to reference potential terminal 16 via resistor 66. The collector of transistor 62 is, further, connected to the base of NPN transistor 68. The emitter of transistor 68 is connected to reference potential terminal 16 directly, while its collector is connected to power source supply terminal 12 via second constant current supply means 46 and also to reference potential terminal 16 via forward biased diode 70. The collector of transistor 68 is, further, connected to the base of NPN transistor 72. The emitter of transistor 72 is directly connected to reference potential terminal 16, while its collector is connected to power source supply terminal 12 via forward biased diode 74. The collector of transistor 72 is, further, connected to the base of PNP transistor 76. The emitter of transistor 76 is directly connected to power source supply terminal 12, while its collector is connected to node 78 along with the collector of transistor 40, first constant current supply means 44 and the base of transistor 62. Output terminal 30 of this circuit is connected to the collector of transistor 62.

In the above circuit, constant current source 42 is comprised of first and second constant current supply means 44 and 46. Constant current $I_{44}$ of first constant current supply means 44 is directly applied to the collector of transistor 40, while constant current $I_{46}$ of second constant current supply means 46 is applied to it through a path including two current mirror circuits 80 and 82 respectively comprised of transistor 72 and diode 70 and transistor 76 and diode 74. Transistors 62 and 68 respectively act as switching control circuit 50 and switch means 48 of the circuit shown in FIG. 3.

In the hysteresis circuit thus constituted, when input level $V_{28}$ at input terminal 28 is low and the collector current of transistor 40 is smaller than the constant current supplied from constant current source 42, transistor 40 is less conductive and the level at connection node 78 is high. In this state, PNP transistor 62 is OFF and thus NPN transistor 68 is OFF. Output level $V_{30}$ at output terminal 30 connected to the collector of transistor 62 is set to low level $V_l$. Transistor 68 in an OFF state fails to deactivate first current mirror circuit 80 so that constant current $I_{46}$ of second constant current supply means 46 is transferred to connection node 78 through first and second current mirror circuits 80 and 82 in turn. Accordingly, PNP transistor 62 whose base is connected to connection node 78 is more and more biased to OFF.

When input level $V_{28}$ becomes high and transistor 40 is sufficiently biased to conduct current $I_{44}+I_{46}$, the level at connection node 78 decreases so as to activate PNP transistor 62. Thus transistor 68 is also activated to an ON state. Output level $V_{30}$ increases to high level $V_h$. Transistor 68 in the ON state deactivates first current mirror circuit 80. Therefore, second constant current supply means 46 is disconnected from connection node 78. Accordingly, constant current $I_{44}$ of first constant current supply means 44 is applied to connection node 78, in spite of transistor 40 being fully biased to the state capable of accepting constant current $I_{44}+I_{46}$. Therefore, even if input level $V_{28}$ at input terminal 28 decreases slightly, transistor 62 is maintained in the ON state so that second constant current supply means 46 continues to be disconnected.

The above situation is maintained until input level $V_{28}$ drops so that transistor 40 is less biased and its collector current lowered below the constant current $I_{44}$ supplied from constant current source 42 at that time. Thus the hysteresis operation of the circuit is achieved.

Figure 6:
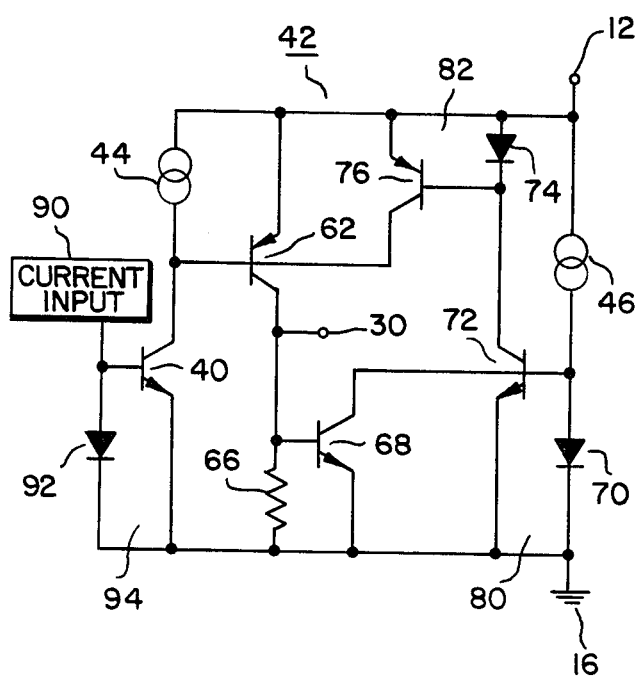
FIGS. 6 and 7 are circuit diagrams showing other embodiments.

The hysteresis circuit of the invention may also be constructed as shown in FIG. 6. The hysteresis circuit of FIG. 6 is a current input type in which signal current source 90 is connected to the base of transistor 40 and is also connected to reference potential terminal 16 via diode 92 which can, for example, be constituted by a diode-connected transistor. Transistor 40 and diode 92 constitute current mirror circuit 94 whereby current, approximately equal to the output current of current signal source 90, flows in the collector of transistor 40. Other portions of FIG. 6 which are the same as in FIG. 5 are identified by the same reference numbers and description thereof is omitted.

Figure 7:
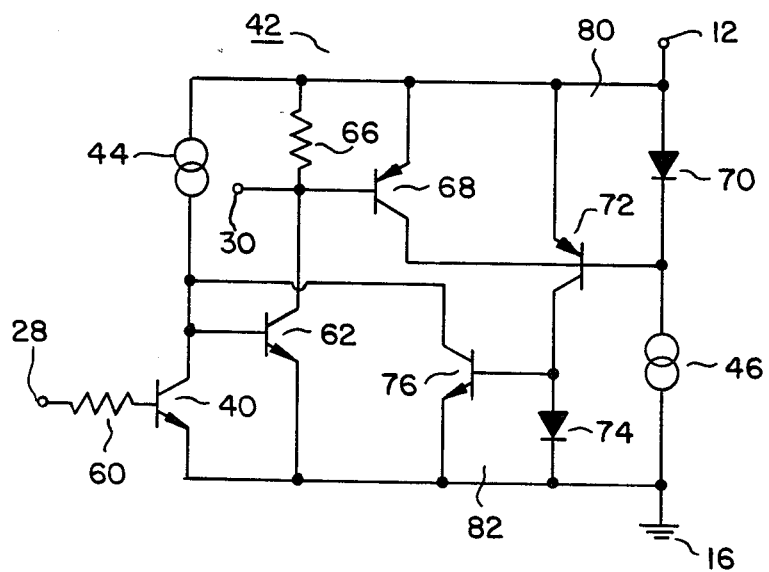

The same advantages as in the circuit of FIG. 5 may also be achieved even if, as seen in the embodiment of FIG. 7, the constant current supplied from the constant current source 42 is reduced by second constant current supply means 46.

In more detail and referring to FIG. 7, when PNP transistor 72, which constitutes the first current mirror circuit 80 together with diode 70, and NPN transistor 76, which constitutes the second current mirror circuit 82 together with diode 74, are both ON, a portion of constant current $I_{44}$ that is approximately equal to constant current $I_{46}$ is bypassed to reference potential terminal 16. Further, NPN transistor 62 turns PNP transistor 68 ON or OFF depending on the collector level of transistor 40, as a result of a switch in the level of the current applied to transistor 40.

Therefore, the hysteresis amplitude $V_{hl}$ of the circuit of FIG. 7 is:

$$V_{hl} = V_T \times \ln [I_{44}/(I_{44}-I_{46})]$$

Stable setting is therefore possible, even when the hysteresis amplitude is small, and as may be appreciated from FIG. 7, the circuit can run on a very low power supply voltage $V_{cc}$. In FIG. 7, 66 is the load resistor of transistor 62. Other portions are the same as in FIG. 5 and the description thereof which would be duplicative is omitted.

An oscillator circuit using the hystersis circuit according to the invention will now be described. Prior to a description of embodiments of the oscillator circuit, a description of what constitutes its basic configuration will be given with reference to FIG. 8.

Figure 8:
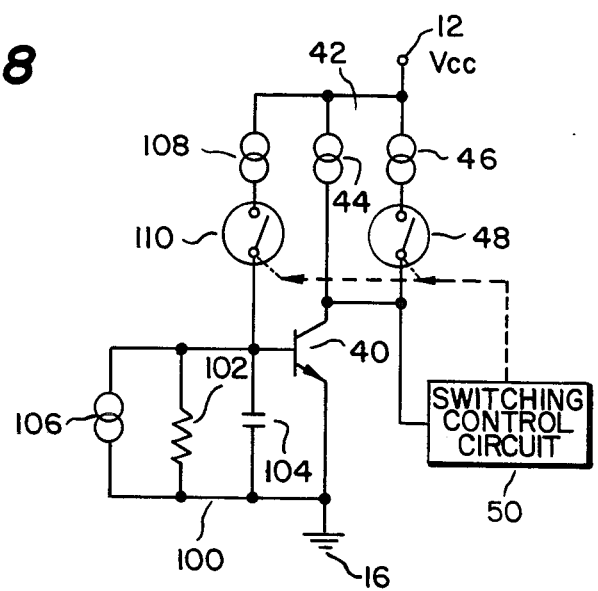
FIG. 8 is a circuit showing the basic configuration of an oscillator using a hysteresis circuit according to the invention.

In FIG. 8, transistor 40, first constant current source 42, first switch means 48 and switching control circuit 50 are connected similarly to the hysteresis circuit of FIG. 3. The base of transistor 40 is connected to reference potential terminal 16 via time constant circuit 100 in which resistor 102, capacitor 104 and variable current source 106 are connected in parallel. The base of transistor 40 is, further, connected to power source supply terminal 12 via a series circuit of second constant current source 108 and second switch means 110. Switching of the second switch means 110 is controlled by switching control circuit 50 in the same way as is the switching of the first switch means 48 in first constant current source 42.

In the variable frequency oscillator circuit thus constituted, immediately after power source voltage $V_{cc}$ is applied, the base level of transistor 40 is low and thus a part of the constant current supplied from first constant current source 42 flows into switching control circuit 50. Switching control circuit 50 thereupon activates first switch means 48 as well as second switch means 110. Consequently, the collector current of transistor 40 increases as capacitor 104 is charged by constant current $I_{108}$ supplied from second constant current source 108. When the collector current of transistor 40 reaches the sum of constant currents $I_{44}$ and $I_{46}$ of first and second constant current supply means 44 and 46, current fails to flow into switching control circuit 50, which therefore deactivates first and second switch means 48 and 110.

Capacitor 104 then starts to discharge via resistor 102 and the collector current of transistor 40 is reduced, as its base level falls. When the collector current of transistor 40 becomes smaller than constant current $I_{44}$ of first constant current supply means 44, again current flows into switching control circuit 50, which therefore activates both of first and second switch means 48 and 110. Subsequently, the above action is repeated, so resulting in generation of oscillations.

Figure 9:
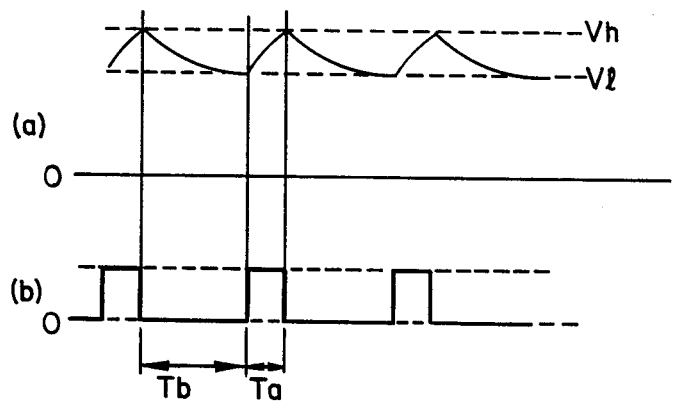
FIG. 9 is a graph showing an oscillation characteristic of the circuit of FIG. 8.

In the circuit of FIG. 8, the oscillation frequency changes as shown in the graph of FIG. 9, since charging period $T_a$ and discharging period $T_b$ of capacitor 104 vary depending on current $I_{106}$ supplied from variable current source 106. In FIG. 9, graphs (a) and (b) respectively represent the base level and the collector level of transistor 40.

Designating the reverse saturation current of transistor 40 as $I_s$ and both high and low states of the collector level of transistor 40 when first and second switch means 48 and 110 are deactivated by switching control circuit 50 and are activated as $V_h$ and $V_l$:

$$V_h = V_T \times \ln[(I_{44}+I_{46})/I_s]$$

$$V_l = V_T \times \ln(I_{44}/I_s)$$

The oscillation amplitude level $V_{osc}$ of the circuit of FIG. 8 is obtained as follows:

$$V_{osc} = V_h - V_l = V_T \times \ln[(I_{44}+I_{47})/I_{44}]$$

and one sees that it is determined by the ratio of the currents $(I_{44}+I_{46})$ and $I_{44}$.

Designating the capacitance and the resistance of capacitor 104 and resistor 102 as $C_{104}$ and $R_{102}$, the charging period $T_a$ and discharge period $T_b$ to capacitor 104 are given by:

$$T_a = C_{104} \cdot R_{102} \cdot \ln[(V_h + R_{102} \cdot I_{106})/(V_l + R_{102} \cdot I_{106})]$$

$$T_b = C_{104} \cdot R_{102} \cdot \ln \frac{[V_h + R_{102} \cdot (I_{106} + I_{108})]}{[V_l + R_{102} \cdot (I_{106} + I_{108})]}$$

There will now be given a detailed description of embodiments of the oscillator circuit using the hysteresis circuit according to the invention, constructed in accordance with the above-described basic configuration.

Figure 10:
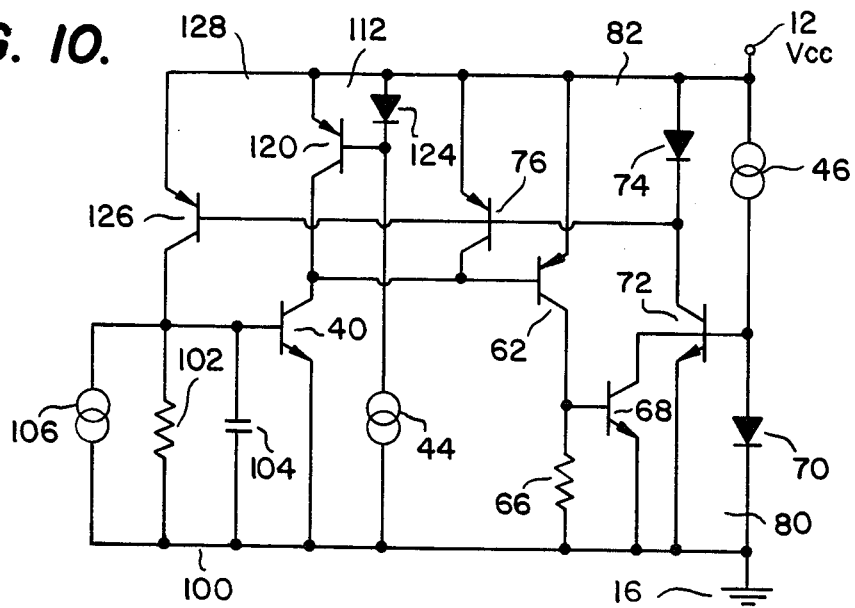
FIG. 10 is a circuit diagram showing one embodiment of an oscillator according to the invention.

FIG. 10 shows a variable frequency oscillator circuit using the hysteresis circuit according to the invention. Elements in FIG. 10 which are the same as in FIG. 5 are identified by the same reference numbers and description thereof will be omitted.

NPN transistor 40 is connected at its emitter directly to reference potential terminal 16 and its collector to power source supply terminal 12 via PNP transistor 120. Transistor 120 forms a current mirror circuit 122 together with forward biased diode 124 which shunts the emitter-base circuit of transistor 120. The base of transistor 120 is connected to reference potential terminal 16 via first constant current supply means 44. Thus constant current $I_{44}$ of first current supply means 44 is applied to transistor 40 through current mirror circuit 122. The base of transistor 40 is connected to power source supply terminal 12 via PNP transistor 126 and also to reference potential terminal 16 via time constant circuit 100 in which resistor 102, capacitor 104 and variable current source 106 are connected in parallel. Other portions of the circuit are the same as the circuit shown in FIG. 5 and the description thereof is consequently omitted. The base of transistor 126 is then connected to the collector of transistor 72. Transistor 126 forms a current mirror circuit 128 together with diode 74 and transistor 76, forms the other current mirror circuit 82 together with diode 74.

In the above circuit, current mirror circuit 128 works as the second constant current source 108 of FIG. 8 by applying constant current $I_{106}$, equivalent to constant current $I_{46}$ supplied from second constant current supply means 46, to time constant circuit 100. The activation or deactivation of current mirror circuit 128 is controlled by transistor 68 according to the collector level of transistor 40.

The hysteresis operation of transistor 40 and the charging/discharging operation of time constant circuit 100 in the variable frequency oscillation circuit thus constituted are respectively similar to those of the circuits shown in FIG. 5 and FIG. 8.

The oscillation frequency and amplitude of the circuits shown in FIGS. 8 and 10 are not affected by fluctuation of the power supply voltage $V_{cc}$ but are very stable. As is well-known, constant currents $I_{44}$, $I_{46}$ and $I_{108}$, that is, the collector currents of transistors 120, 76 and 126, can be altered by changing their respective emitter areas.

Since, as seen in FIG. 10, there is no section where the base-emitter voltages of the transistors and the forward voltages of the diodes are imposed in series, the variable frequency oscillation circuit of FIG. 10 is an extremely good circuit that can operate at very small power supply voltages $V_{cc}$ of 0.8 to 0.9 V.

Figure 11:
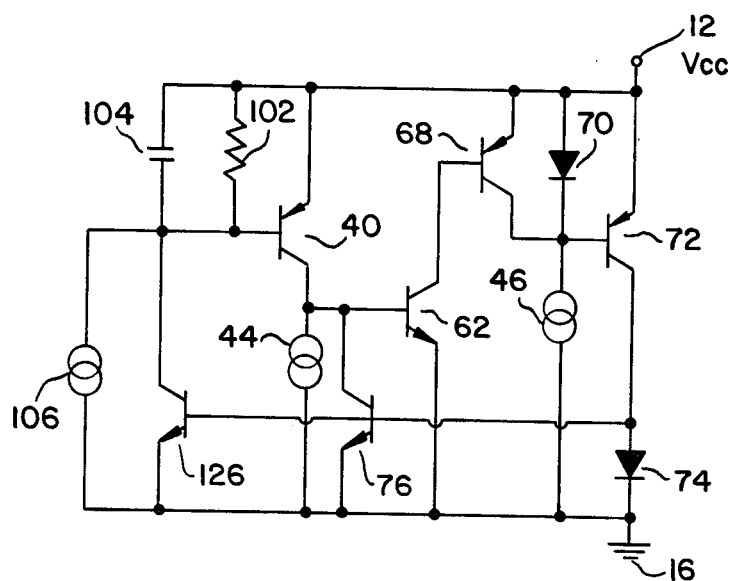
FIGS. 11 and 12 are circuit diagrams showing other embodiments of the invention.

The variable frequency oscillation circuit of the invention is not limited to the circuit of FIG. 10 but may also be constituted as shown in FIG. 11. The circuit of FIG. 11 corresponds to a circuit constructed with the opposite conduction type to that of the transistors in the circuit of FIG. 10. Portions of FIG. 11 that are the same as FIG. 10 are identified by the same reference numbers.

Figure 12:
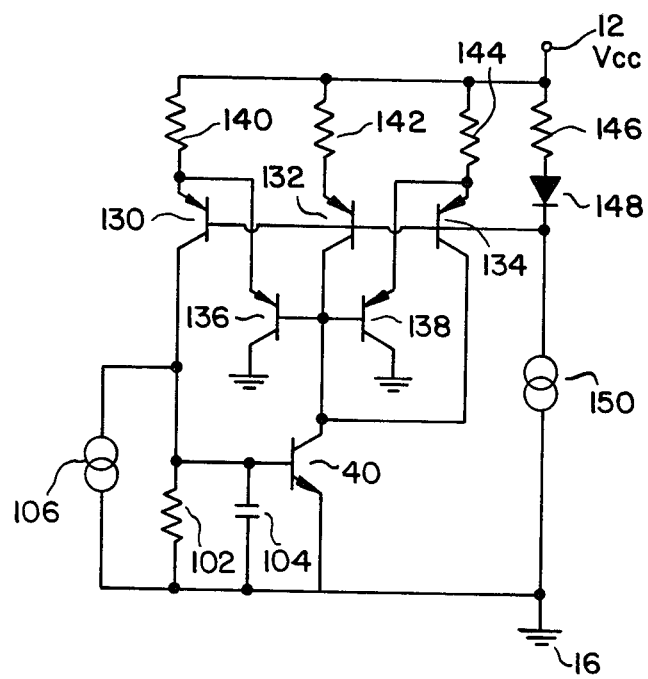

The variable frequency oscillation circuit of the invention may also be constructed in the manner shown in FIG. 12. In the circuit of FIG. 12, sections corresponding to constant current sources 42 and 108, switch means 48 and 110 and switching control circuit 50 of FIG. 8 are respectively constituted by transistors 130–138, resistors 140–146, diode 148 and constant current source 150. In this circuit, when transistors 136 and 138 are both ON, the emitter levels of transistors 130 and 134 fall and transistors 130 and 134 are brought to cut-off, which corresponds to the state where switch means 48 and 108 of FIG. 8 are deactivated. Portions of FIG. 12 which are the same as FIG. 8 are identified by the same reference numbers and description thereof will be omitted.

It is possible to have a variety of other modifications or applications without departure from the spirit of the invention.

What is claimed is:

1. A hysteresis circuit comprising:
   a power source;
   a reference potential source;
   input means operative in one of two conductive states connected to said reference potential source for receiving an input signal;
   a constant current source connected between said power source and said input means providing first and second current levels to said input means corresponding to said two respective conductive states;
   output means responsive to said first and second levels of current for deriving a bilevel hysteresis output signal; and
   means for detecting current flowing through said input means and controlling said current source between said first and second levels of current in response to said current flowing through said input means.

2. The hysteresis circuit of claim 1 wherein said input means is a transistor whose emitter is connected to said reference potential source.

3. The hysteresis circuit according to claim 2, wherein said constant current source is comprised of first and second constant current supply means.

4. The hysteresis circuit according to claim 3, wherein the first of said two constant current supply means is permanently connected between said power source and the collector of said transistor and the second is switchably connected between said power source and the collector of said transistor.

5. The hysteresis circuit according to claim 4, wherein the constant current of said second constant current supply means is combined with the constant current of said first constant current supply means when said second constant current supply means is connected in response to said detecting and controlling means.

6. An oscillator circuit comprising:
   a power source;
   a reference potential source;
   input means operative in one of two conductive states connected to said reference potential source for receiving an input signal;
   a first constant current source connected between said power source and said input means providing first and second current levels to said input means corresponding to said two respective conductive states;
   output means responsive to said first and second levels of current for developing a bilevel hysteresis signal;
   means for detecting current flowing through said input means and controlling said first constant current source between said first and second levels of current in response to said current flowing through said input means;
   a time constant circuit connected to said input means; and
   a second constant current source switchably connected between said power source and said time constant circuit.

7. The oscillator circuit of claim 6 wherein said input means is a transistor whose emitter is connected to said reference potential source and said base is connected to said time constant circuit.

8. An oscillator circuit according to claim 7, wherein said first constant current source is comprised of first and second constant current supply means.

9. An oscillator circuit according to claim 8, wherein the first of said two constant current supply means is permanently connected between said power source and the collector of said transistor and the second of said two constant current supply means is switchably connected between said power source and the collector of said transistor.

10. An oscillator circuit according to claim 9, wherein said second constant current source is switched to being conductively connected in response to said detecting and controlling means together with said second constant current supply means.

* * * * *